United States Patent
Welser et al.

(10) Patent No.: US 7,186,624 B2
(45) Date of Patent: Mar. 6, 2007

(54) BIPOLAR TRANSISTOR WITH LATTICE MATCHED BASE LAYER

(75) Inventors: Roger E. Welser, Providence, RI (US); Paul M. Deluca, Providence, RI (US); Noren Pan, Newton, MA (US)

(73) Assignee: Kopin Corporation, Taunton, MA (US)

(*) Notice: Subject to any disclaimer, the term of this patent is extended or adjusted under 35 U.S.C. 154(b) by 0 days.

(21) Appl. No.: 10/824,697

(22) Filed: Apr. 14, 2004

(65) Prior Publication Data

US 2005/0064672 A1    Mar. 24, 2005

Related U.S. Application Data

(62) Division of application No. 09/995,079, filed on Nov. 27, 2001, now Pat. No. 6,750,480.

(60) Provisional application No. 60/253,159, filed on Nov. 27, 2000.

(51) Int. Cl.
*H01L 21/331* (2006.01)

(52) U.S. Cl. ............... 438/312; 257/103; 257/197; 257/198; 600/615

(58) Field of Classification Search ............... 438/312
See application file for complete search history.

(56) References Cited

U.S. PATENT DOCUMENTS

| | | | |
|---|---|---|---|
| 4,518,979 A | 5/1985 | Dumke et al. | |
| 5,371,389 A | 12/1994 | Matsuno et al. | |
| 5,429,957 A | 7/1995 | Matsuno et al. | |
| 5,571,732 A | 11/1996 | Liu | |
| 5,606,185 A | 2/1997 | Nguyen et al. | |
| 5,814,843 A | 9/1998 | Ohkubo | |
| 5,858,818 A | 1/1999 | Ro et al. | |
| 5,903,018 A | 5/1999 | Shimawaki | |
| 6,031,256 A | 2/2000 | Liu et al. | |
| 6,150,677 A | 11/2000 | Tanaka et al. | |
| 6,285,044 B1 | 9/2001 | Bhat | |
| 6,765,242 B1 * | 7/2004 | Chang et al. | 257/197 |

(Continued)

FOREIGN PATENT DOCUMENTS

FR    2 795 871 A1    1/2001

(Continued)

OTHER PUBLICATIONS

Chang, et al., "InGaAsN/AlGaAs P-n-p heterojunction bipolar transistor," *Applied Physics Letters*, 79(19):2788-2790 (2000).

(Continued)

*Primary Examiner*—Carl Whitehead, Jr.
*Assistant Examiner*—Colleen E. Rodgers
(74) *Attorney, Agent, or Firm*—Hamilton, Brook, Smith & Reynolds, P.C.

(57) ABSTRACT

A semiconductor material which has a high carbon dopant concentration and is composed of gallium, indium, arsenic and nitrogen is disclosed. The material is useful in forming the base layer of gallium arsenide based heterojunction bipolar transistors because it can be lattice matched to gallium arsenide by controlling the concentration of indium and nitrogen. The disclosed semiconductor materials have a low sheet resistivity because of the high carbon dopant concentration obtained.

17 Claims, 7 Drawing Sheets

---

500 Å Si-doped $In_{0.6}Ga_{0.4}As$ ($1 \times 10^{19}$ cm$^{-3}$)

500 Å Si-doped InGaAs Grade ($1 \times 10^{19}$ cm$^{-3}$)

1500 Å Si-doped GaAs ($5 \times 10^{18}$ cm$^{-3}$)

500 Å Si-doped InGaP ($4 \times 10^{17}$ cm$^{-3}$)

500-1800 Å C-doped $Ga_{1-x}In_xAs_{1-y}N_y$ ($1.5 - 4.5 \times 10^{19}$ cm$^{-3}$)
$x \approx 3y$ 7500 Å Si-doped GaAs ($1 \times 10^{16}$ cm$^{-3}$)

5000 Å Si-doped GaAs ($5 \times 10^{18}$ cm$^{-3}$)

GaAs SUBSTRATE

U.S. PATENT DOCUMENTS

| | | |
|---|---|---|
| 6,847,060 B2 | 1/2005 | Welser et al. |
| 2001/0040244 A1 | 11/2001 | Fitzgerald et al. |
| 2002/0027232 A1 | 3/2002 | Shigematsu et al. |
| 2002/0102847 A1 | 8/2002 | Sharps et al. |
| 2005/0020033 A1* | 1/2005 | Specht et al. ............... 438/478 |

FOREIGN PATENT DOCUMENTS

| | | |
|---|---|---|
| JP | 11312685 | 11/1999 |
| WO | WO 01/03194 A1 | 1/2001 |
| WO | WO 02/43155 A2 | 5/2002 |

OTHER PUBLICATIONS

Welser, et al., "Low $V_{be}$ GaInAsN Base Heterojunction Bipolar Transistors," *IEICE Trans. Electron.*, E84-C(10): 1389-1393 (2001).

Li, et al., "DC characteristics of MOVPE-grown Npn InGaP/InGaAsN DHBTs," *Electronics Letters*, 36(1): 81-83 (2000).

Kohama, et al., "Using Carbon Tetrachloride for Carbon Doping $Al_xGa_{1-x}$ As Grown by Metalorganic Chemical Vapor Deposition," *Jpn. J. Appl. Phys.*, 34(7A): 3504-3505 (1995).

Sugiura, et al., "Characterization of heavily carbon-doped InGaAsP layers grown by chemical beam epitaxy using tetrabromide," *Applied Physics Letters*, 73(17):2482-2484 (1998).

Bhat, et al., "Growth of GaAsN/GaAs, GaInAsN/GaAs and GaInAsN/GaAs quantum wells by low-pressure organometallic chemical vapor deposition," *Journal of Crystal Growth*, 195: 427-437 (1998).

Chang, et al., "InGaP/InGaAsN/GaAs NpN double-heterojunction bipolar transistor," *Applied Physics Letters*, 76(16):2262-2264 (2000).

Welser, R.E., et al., "Role of Neutral Base Recombination in High Gain AlGaAs/GaAs HBT's," *IEEE Transactions on Electron Devices*, 46(8):1599-1607(1999).

Ahmari, D.A., et al., "High-speed InGaP/GaAs HBT's with a Strained $In_xGa_{1-x}As$ Base," *IEEE Electron Device Letters*,17(5):226-228(1996).

Welser, R.E., et al., "Turn-on Voltage Investigation of GaAs-Based Bipolar Transistors with $Ga_{1-x}In_xAs_{1-y}N_y$ Base Layers," *IEEE Electron Device Letters*, 21(12):1-4(2000).

Low, T., et al., "InGaP HBT technology for RF and microwave instrumentation," *Solid-State Electronics*, 43:1437-1444(1999).

Liu, W., et al., "Current Transport Mechanism in GaInP/GaAs Heterojunction Bipolar Transistors," *IEEE Transactions on Electron Devices*, 40(8):1378-1383(1993).

Lu, Z.H., et al., "Determination of band gap narrowing and hole density for heavily C-doped GaAs by photoluminescence," *Appl. Phys. Lett.*, 64(1): 88-90(1994).

Welser, R.E., et al., "High Performance $Al_{0.35}Ga_{0.65}As/GaAs$ HBT's," *IEEE Electron Device Letters*, 21(5):196-199(2000).

Welser, R.E., et al., "Base Current Investigation of the Long-Term Reliability of GaAs-Based HBTs," *GaAs Mantech*, (2000).

Patton, G.L., et al. "Graded-SiGe-Base, Poly-Emitter Heterojunction Bipolar Transistors," *IEEE Electron Device Letters*, 10(12):534-536(1989).

Ida, M., et al., "InP/InGaAs DHBTs with 341-Ghz $f_T$ at high current density of over 800 kA/cm$^2$," *IEEE*, (2001).

Kroemer, H., "Heterostructure bipolar transistors: What should we build?" *J. Vac. Sci. Technol.*, B1(2):126-130(1983).

Fujihara, A., et al., "High-speed InP/InGaAs DHBTs with Ballistic Collector Launcher Structure," *IEEE*, (2001).

Nakahara, K., et al., "Continuous-wave operation of long-wavelength GaInNAs/GaAs quantum well laser," *Electronic Letters*, 32(17): 1585-1586(1996).

Mochizuki, K., et al., "GaInP/GaAs Collector-Up Tunneling-Collector Heterojunction Bipolar Transistors (C-Up TC-HBTs): Optimization of Fabrication Process and Epitaxial Layer Structure for High-Efficiency High-Power Amplifiers," *Transactions on Electron Devices*, 47(12):2277-2283(2000).

Pan, N., et al., "Pseudomorphic In-Graded Carbon Doped GaAs Base Heterojunction Bipolar Transistors by Metal Organic Chemical Vapor Deposition," *Journal of Electronic Materials*, 25(7):13 (1996).

Ohkubo, M., et al., "Compositionally Graded C-doped $In_{1-x}Ga_xAs$ Base in InP/InGaAs D-HBTs Grown by MOCVD with Low Base Sheet Resistance and High Current Gain", *IEEE*, pp. 641-644, 1997.

Stockman, S. A., et al., "Carbon Doping of $In_xGa_{1-x}As$ By MOCVD Using $CCl_4$", pp. 40-43, no date given.

Keiper, D., et al., "Metalorganic Vapour Phase Epitaxy Growth of InP-based Heterojunction Bipolar Transistors with Carbon Doped InGaAs Base Using Tertiarybutylarsine and Tertiarybutylphosphine in $N_2$ Ambient", XP-001030248, *Jpn. J. Appl. Phys.*, vol. 39:6162-6165 (2000).

Stillman, G. E., et al., "Carbon-doped InGaAs grown by MOCVD for InP/InGaAs heterojunction bipolar transistors", *Inst. Phys. Conf. Ser. No. 129*:687-692 (1992).

Kroemer, H., "Two Integral Relations Pertaining to the Electron Transport Through a Bipolar Transistor With a Nonuniform Energy Gap in the Base Region," *Solid-State Electronic*, 28(11):1101-1103 (1985).

Maziar, C. M., and Lundstrom, M. S., "On the Estimation of Base Transit Time in AlGaAs/GaAs Bipolar Transistors," *IEEE Electron Device Lett.* 8: 90-91 (1987).

Stockman, S. A., et al., "Growth of carbon-doped p-type $In_xGa_{1-x}As$ ($0<x \leq 0.53$) by metalorganic chemical vapor deposition," *Appl. Phys. Lett* 60(23):2903-2905 (1992).

* cited by examiner

| 500 Å Si-doped $In_{0.6}Ga_{0.4}As$ ($1 \times 10^{19}$ $cm^{-3}$) |
|---|
| 500 Å Si-doped InGaAs Grade ($1 \times 10^{19}$ $cm^{-3}$) |
| 1500 Å Si-doped GaAs ($5 \times 10^{18}$ $cm^{-3}$) |
| 500 Å Si-doped InGaP ($4 \times 10^{17}$ $cm^{-3}$) |
| 500-1800 Å C-doped $Ga_{1-x}In_xAs_{1-y}N_y$ ($1.5$-$4.5 \times 10^{19}$ $cm^{-3}$) $x \approx 3y$ |
| 7500 Å Si-doped GaAs ($1 \times 10^{16}$ $cm^{-3}$) |
| 5000 Å Si-doped GaAs ($5 \times 10^{18}$ $cm^{-3}$) |
| GaAs SUBSTRATE |

FIG. 1

| 500 Å Si-doped $In_{0.6}Ga_{0.4}As$ ($1\times10^{19}$ $cm^{-3}$) |
|---|
| 500 Å Si-doped InGaAs Grade ($1\times10^{19}$ $cm^{-3}$) |
| 1500 Å Si-doped GaAs ($5\times10^{18}$ $cm^{-3}$) |
| 500 Å Si-doped InGaP ($4\times10^{17}$ $cm^{-3}$) |
| 50 Å transitional layer |
| 500 Å C-doped-$Ga_{1-x}In_xAs_{1-y}N_y$ ($1.5$–$4.5\times10^{19}$ $cm^{-3}$) $x \approx 3y$ compositional grade |
| 50 Å transitional layer |
| ~200 Å Si-doped InGaP |
| 4000 Å Si-doped GaAs ($1\times10^{16}$ $cm^{-3}$) |
| 5000 Å Si-doped GaAs ($5\times10^{18}$ $cm^{-3}$) |
| GaAs SUBSTRATE |

FIG. 7

BIPOLAR TRANSISTOR WITH LATTICE MATCHED BASE LAYER

RELATED APPLICATION

This application is a divisional of U.S. application Ser. No. 09/995,079, filed on Nov. 27, 2001 (now U.S. Pat. No. 6,750,480 B2), which claims the benefit of U.S. Provisional Application No. 60/253,159, filed on Nov. 27, 2000, the teachings of both of which are incorporated herein in their entirety.

GOVERNMENT SUPPORT

The invention was supported, in whole or in part, by grant F33615-99-C-1510 from the Small Business Technology Transfer (STTR) Program of the U.S. Air Force. The government has certain rights in the invention.

BACKGROUND OF THE INVENTION

Bipolar junction transistors (BJT) and heterojunction bipolar transistor (HBT) integrated circuits (ICs) have developed into an important technology for a variety of applications, particularly as power amplifiers for wireless handsets, microwave instrumentation, and high speed (>10 Gbit/s) circuits for fiber optic communication systems. Future needs are expected to require devices with lower voltage operation, higher frequency performance, higher power added efficiency, and lower cost production. The turn-on voltage of a BJT or HBT is defined as the base-emitter voltage ($V_{be}$) required to achieve a certain fixed collector current density ($J_c$). The turn-on voltage can limit the usefulness of devices for low power applications in which supply voltages are constrained by battery technology and the power requirements of other components.

Unlike BJTs in which the emitter, base and collector are fabricated from one semiconductor material, HBTs are fabricated from two dissimilar semiconductor materials in which the emitter semiconductor material has a wider band gap than the semiconductor material from which the base is fabricated. This results in a superior injection efficiency of carriers from the base to collector over BJTs because there is a built in barrier impeding carrier injection from the base back to the emitter. Selecting a base with a smaller band gap decreases the turn-on voltage because an increase in the injection efficiency of carriers from the base into the collector increases the collector current density at a given base-emitter voltage.

HBTs, however, can suffer from the disadvantage of having an abrupt discontinuity in the band alignment of the semiconductor material at the heterojunction can lead to a conduction band spike at the emitter-base interface of the HBT. The effect of this conduction band spike is to block electron transport out of the base into the collector. Thus, electrons stay in the base longer resulting in an increased level of recombination and a reduction of collector current gain ($\beta_{dc}$). Since, as discussed above, the turn-on voltage of heterojunction bipolar transistors is defined as the base-emitter voltage required to achieve a certain fixed collector current density, reducing the collector current gain effectively raise the turn-on voltage of the HBT. Consequently, further improvements in the fabrication of semiconductor materials of HBTs are necessary to lower the turn-on voltage, and thereby improve low voltage operation devices.

SUMMARY OF THE INVENTION

The present invention provides an HBT having an n-doped collector, a base formed over the collector and composed of a III-V material that includes indium and nitrogen, and an n-doped emitter formed over the base. The III-V material of the base layer has a carbon dopant concentration of about $1.5 \times 10^{19}$ cm$^{-3}$ to about $7.0 \times 10^{19}$ cm$^{-3}$. In a preferred embodiment, the base layer includes the elements gallium, indium, arsenic, and nitrogen. The presence of nitrogen in the material and the high dopant concentration of the materials of the invention reduce the band gap and the sheet resistivity ($R_{sb}$) of the material which results in a lower turn-on voltage. The HBTs of the present invention have a lower turn-on voltage than GaAs-based HBTs of the prior art.

In a preferred embodiment, the III-V compound material system can be represented by the formula $Ga_{1-x}In_xAs_{1-y}N_y$. It is known that the energy-gap of $Ga_{1-x}In_xAs$ drops substantially when a small amount of nitrogen is incorporated into the material. Moreover, because nitrogen pushes the lattice constant in the opposite direction from indium, $Ga_{1-x}In_xAs_{1-y}N_y$ alloys can be grown lattice-matched to GaAs by adding the appropriate ratio of indium to nitrogen to the material. Thus, excess strain which results in an increased band gap and misfit dislocation of the material can be eliminated. The ratio of indium to nitrogen is thus selected to reduce or eliminate strain. In a preferred embodiment of the present invention, x=3y in the $Ga_{1-x}In_xAs_{1-y}N_y$ base layer of the HBT.

In one embodiment, the transistor is a double heterojunction bipolar transistor (DHBT) having a base composed of a semiconductor material which is different from the semiconductor material from which the emitter and collector are fabricated. In a preferred embodiment of a DHBT, the $Ga_{1-x}In_xAs_{1-y}N_y$ base layer can be represented by the formula $Ga_{1-x}In_xAs_{1-y}N_y$, the collector is GaAs and the emitter is selected from InGaP, AlInGaP and AlGaAs.

Another preferred embodiment of the invention relates to a HBT or DHBT in which the height of the conduction band spike is lowered in combination with lowering of the base layer energy gap ($E_{gb}$). Conduction band spikes are caused by a discontinuity in the conduction band at the base/emitter heterojunction or the base/collector heterojunction. Reducing the lattice strain by lattice matching the base layer to the emitter and/or the collector layer reduces the conduction band spike. This is typically done by controlling the concentration of the nitrogen and the indium in the base layer. Preferably, the base layer has the formula $Ga_{1-x}In_xAs_{1-y}N_y$ wherein x is about equal to 3y.

In one embodiment, the base can be compositionally graded to produce a graded band gap layer having a narrow band gap at the collector and a wider band gap at the emitter. For example, a $Ga_{1-x}In_xAs_{1-y}N_y$ base layer of a DHBT can be graded such that x and 3y are about equal to 0.01 at the collector and are graded to about zero at the emitter. The base layer can also be dopant graded such that the dopant concentration is higher near the collector and decrease gradually across the thickness of the base to the base emitter heterojunction. Methods of forming graded base layers are known to those skilled in the art and can be found on pages 303–328 of Ferry, et al., *Gallium Arsenide Technology* (1985), Howard W. Sams & Co., Inc. Indianapolis, Ind., the entire teachings of which are incorporated herein by reference.

Another method of minimizing the conduction band spike is to include one or more transitional layers between the heterojunction. Transitional layers having low band gap set back layers, graded band gap layers, doping spikes or a combination thereof can be used to minimize the conduction band spike. In addition, one or more lattice-matched layers can be present between the base and emitter or base and collector to reduce the lattice strain on the materials at the heterojunction.

The present invention also provides a method of fabricating an HBT and a DHBT. The method involves growing a base layer composed of gallium, indium, arsenic and nitrogen over an n-doped GaAs collector. The base layer is grown using an internal and external carbon source to provide carbon doped base layer. An n-doped emitter layer is then grown over the base layer. The use of an internal and external carbon source to provide the carbon dopant for the base layer results in a material with a higher carbon dopant concentration than has been achieved in the prior art. Typically, dopant levels of about $1.5 \times 10^{19}$ cm$^{-3}$ to about $7.0 \times 10^{19}$ cm$^{-3}$ are achieved using the method of the invention. In a preferred embodiment, dopant levels of about $3.0 \times 10^{19}$ cm$^{-3}$ to about $7.0 \times 10^{19}$ cm$^{-3}$ are achieved with the method of the invention. A higher dopant concentration in a material reduces the sheet resistivity and band gap of the material. Thus, the higher the dopant concentration in the base layer of an HBT and DHBT, the lower the turn on voltage of the device.

The present invention also provides a material represented by the formula $Ga_{1-x}In_xAs_{1-y}N_y$, in which x and y are each, independently, about $1.0 \times 10^{-4}$ to about $2.0 \times 10^{-1}$. Preferably, x is about equal to 3y. More preferably, x and 3y are about equal to 0.01. The material is doped with carbon at a concentration of about $1.5 \times 10^{19}$ cm$^{-3}$ to about $7.0 \times 10^{19}$ cm$^{-3}$. Preferably, the carbon dopant concentration is about $3.0 \times 10^{19}$ cm$^{-3}$ to about $7.0 \times 10^{19}$ cm$^{-3}$.

The reduction in turn-on voltage allows for better management of the voltage budget on both wired and wireless GaAs-based RF circuits, which are constrained either by standard fixed voltage supplies or by battery output. Lowering the turn-on voltage also alters the relative magnitude of the various base current components in a GaAs-based HBT. DC current gain stability as a function of both junction temperature and applied stress has been previously shown to rely critically on the relative magnitudes of the base current components. The reduction in reverse hole injection enabled by a low turn-on voltage is favorable for both the temperature stability and long-term reliability of the device. Thus, strain free $Ga_{1-x}In_xAs_{1-y}N_y$ base materials having a high dopant concentration enhance RF performance in GaAs-based HBTs and DHBTs.

BRIEF DESCRIPTION OF THE DRAWINGS

FIG. 1 illustrates a InGaP/GaInAsN DHBT structure of a preferred embodiment of the invention in which x is about equal to 3y.

FIG. 7 illustrates a preferred InGaP/GaInAsN DHBT structure which has a transitional layer between the emitter and the base and a transitional layer and lattice matched layer between the collector and the base.

DETAILED DESCRIPTION OF THE INVENTION

Figure 2:
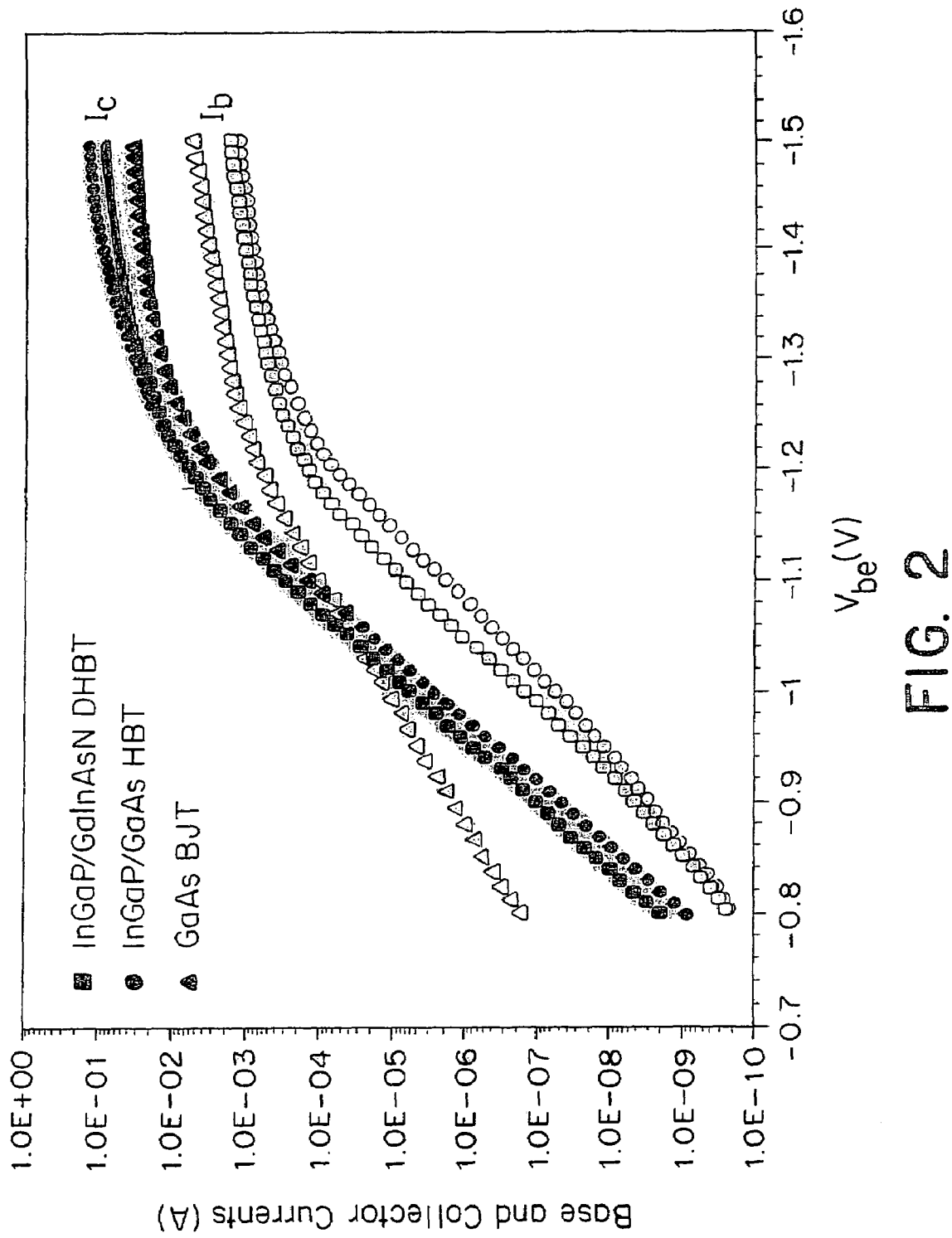
FIG. 2 is a Gummel plot which graphical illustrates the base and collector currents as a function of turn on voltage for an InGaP/GaInAsN DHBT of the invention and for an InGaP/GaAs HBT and a GaAs/GaAs BJT of the prior art.

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

A III-V material is a semiconductor having a lattice comprising at least one element from column III(A) of the periodic table and at least one element from column V(A) of the periodic table. In one embodiment, the III-V material is a lattice comprised of gallium, indium, arsenic and nitrogen. Preferably, the III-V material can be represented by the formula $Ga_{1-x}In_xAs_{1-y}N_y$, wherein x and y are each, independently, about $1.0 \times 10^{-4}$ to about $2.0 \times 10^{-1}$. More preferably, x is about equal to 3y. In a most preferred embodiment, x and 3y are about 0.01.

The term "transitional layer," as used herein, refers to a layer that is between the base/emitter heterojunction or the base/collector heterojunction and has the function of minimizing the conduction band spike of the heterojunction. One method of minimizing the conduction band spike is to use a series of transitional layers wherein the band gaps of the transitional layers gradually decrease from the transitional layer nearest in proximity to the collector to the transitional layer nearest in proximity to the base in a base/collector heterojunction. Likewise, in a emitter/collector heterojunction, the band gaps of the transitional layers gradually decrease from the transitional layer nearest in proximity to the emitter to the transitional layer nearest in proximity to the base. Another method of minimizing the conduction band spike is to use a transitional layer having a graded band gap. The band gap of a transitional layer can be graded by grading the dopant concentration of the layer. For example, the dopant concentration of the transitional layer can be higher near the base layer and can be gradually decreased near the collector or the emitter. Alternatively, lattice strain can be used to provide a transitional layer having a graded band gap. For example, the transitional layer can be compositionally graded to minimize the lattice strain at the surface of the layer in contact with the base and increase the lattice strain at the surface in contact with the collector or emitter. Another method of minimizing the conduction band spike is to use a transitional layer having a spike in the dopant concentration. One or more of the above described methods for minimizing the conduction band spike can be used in the HBTs of the invention. Suitable transitional layer for the HBTs of the invention include GaAs, InGaAs and InGaAsN.

A lattice matched layer is a layer which is grown on a material having a different lattice constant. The lattice matched layer typically has a thickness of about 500 Å or less and conforms to the lattice constant of the under lying layer. This results in lattice strained which causes band gap deformation and results in a band gap intermediate between the band gap of the underlying layer and the band gap of the lattice matched material if it were not strained. Methods of forming lattice matched layers are known tho those skilled in the art and can be found in on pages 303–328 of Ferry, et al., *Gallium Arsenide Technology* (1985), Howard W. Sams & Co., Inc. Indianapolis, Ind. A preferred material for lattice matched layers of the HBTs of the invention is InGaP.

The HBTs and DHBTs of the invention can be prepared using any metalorganic chemical vapor deposition (MOCVD) epitaxial growth system. Preferred MOCVD epitaxial growth systems are Aixtron 2400 and Aixtron 2600 platforms. In the HBTs and the DHBTs prepared by the method of the invention, typical, an un-doped GaAs buffer layer was grown after in-situ oxide desorption. A subcollector layer containing a high concentration of an n-dopant (e.g., dopant concentration about $1 \times 10^{18}$ $cm^{-3}$ to about $9 \times 10^{18}$ $cm^{-3}$) was grown at a temperature of about 700° C. A collector layer with a low concentration of a n-dopant (e.g., dopant concentration about $5 \times 10^{15}$ $cm^{-3}$ to about $5 \times 10^{16}$ $cm^{-3}$) was grown over the subcollector at a temperature of about 700° C. Preferably, the subcollector and the collector are GaAs. The subcollector layer typically had a thickness of about 4000 Å to about 6000 Å, and the collector typically had a thickness of about 3000 Å to about 5000 Å. In one embodiment, the dopant in the subcollector and/or the collector was silicon. Optionally, a lattice-match InGaP tunnel layer can be grown over the collector under typical growth conditions. A lattice-matched layer generally has a thickness of about 500 Å or less, preferably about 200 Å or less, and has a dopant concentration of about $1 \times 10^{16}$ $cm^{-3}$ to about $1 \times 10^{18}$ $cm^{-3}$. One or more transitional layers can optionally be grown under typical growth conditions on the lattice-matched layer or on the collector if no lattice-match layer is used. Transitional layer can be prepared from n-doped GaAs, n-doped InGaAs or n-doped InGaAsN. Transitional layers optionally can be compositionally or dopant graded or can contain a dopant spike. Transitional layers typically have a thickness of about 75 Å to about 25 Å. The carbon doped GaInAsN base layer was grown over the collector if neither a lattice-matched or a transitional layer was used. Optionally, the carbon doped GaInAsN base layer can be grown over the transitional layer or over the lattice-matched layer if a transitional layer was not used. The base layer was grown at a temperature below about 750° C. and was typically about 400 Å to about 1500 Å thick. In a preferred embodiment, the base layer was grown at a temperature of about 500° C. to about 600° C. The base layer was grown using a gallium source, such as trimethylgallium or triethylgallium, an arsenic source, such as arsine, tributylarsine or trimethylarsine, an indium source, such as trimethylindium, and a nitrogen source, such as ammonia or dimethylhydrazine. A low molar ratio of the arsenic source to the gallium source is preferred. Typically, the ratio molar ratio of the arsenic source to the gallium source was less than about 3.5. More preferably, the ratio is about 2.0 to about 3.0. The levels of the nitrogen and indium sources were adjusted to obtain a material which was composed of about 0.01% to about 20% indium and about 0.01% to about 20% nitrogen. In a preferred embodiment, the indium content of the base layer was about three times higher than the nitrogen content. In a more preferred embodiment, the indium content was about 1% and the nitrogen content was about 0.3%. A GaInAsN layer having a low concentration of carbon dopant (e.g., $1.0 \times 10^9$ $cm^{-3}$ or lower) has been achieved without the use of an external carbon source presumably because carbon is derived internally from the gallium source. In the present invention, a GaInAsN layer having a high carbon dopant concentration of about $1.5 \times 10^{19}$ $cm^{-3}$ to about $7.0 \times 10^{19}$ $cm^{-3}$ was achieved by using an external carbon source in addition to the gallium source. The external carbon source used was carbon tetrabromide. Carbon tetrachloride is also an effective external carbon source. Optionally, one or more transitional layer can be grown of n-doped GaAs, n-doped InGaAs or n-doped InGaAsN between the base and the emitter. Transitional layers between the base and emitter are lightly doped (e.g., about $5.0 \times 10^{15}$ $cm^{-3}$ to about $5.0 \times 10^{16}$ $cm^{-3}$) and optionally contain a dopant spike. Preferably, transitional layers are about 25 Å to about 75 Å thick. An emitter layer was grown over the base, or optionally over a transitional layer, at a temperature of about 700° C. and is typically about 400 Å to about 1500 Å thick. The emitter layer was either InGaP, AlInGaP, or AlGaAs. In a preferred embodiment, the emitter layer was InGaP. The emitter layer was n-doped at a concentration of about $1.0 \times 10^{17}$ $cm^{-3}$ to about $9.0 \times 10^{17}$ $cm^{-3}$. An emitter contact layer GaAs containing a high concentration of an n-dopant (e.g., about $1.0 \times 10^{18}$ $cm^{-3}$ to about $9 \times 10^{18}$ $cm^{-3}$) was grown over the emitter at a temperature of about 700° C. Typically, the emitter contact layer is about 1000 Å to about 2000 Å thick. A InGaAs layer with a ramped in indium composition and a high concentration of an n-dopant (e.g., about $5 \times 10^{18}$ $cm^{-3}$ to about $5 \times 10^9$ $cm^{-3}$) was grown over the emitter contact layer. This layer was about 400 Å to about 1000 Å thick.

To illustrate the effect of reducing the band gap of the base layer and/or minimizing the conduction band spike at the emitter/base heterojunction, three different types of GaAs-based bipolar transistor structures were compared: GaAs emitter/GaAs base BJTs, InGaP/GaAs HBTs of the prior art, and InGaP/GaInAsN DHBTs of the invention. The InGaP/GaInAsN DHBT structures used in the following experiments is illustrated in FIG. 1. The prior art InGaP/GaAs HBTs are similar to the DHBTs in FIG. 1 except that no indium or nitrogen was added to the base (x=y=0). Thus, there is only one heterojunction at the emitter/base interface since the base and the collector are both formed from GaAs. The GaAs base layer of the InGaP/GaAs HBT has a larger band gap than the base of the InGaP/GaInAsN DHBT. GaAs/GaAs BJTs have no heterojunctions since the emitter, collector and base are all made of GaAs. Thus, GaAs BJT structures are used as a reference to determine what impact, if any, a conduction band spike at the base-emitter interface has on the collector current characteristics of InGaP/GaAs HBTs. In the DHBTs of FIG. 1, InGaP is chosen as the emitter material with the $Ga_{1-x}In_xAs_{1-y}N_y$ base because InGaP has a wide band gap, and its conduction band lines up with the conduction band of the $Ga_{1-x}In_xAs_{1-y}N_y$ base. Comparison of the DHBTs of FIG. 1 and the HBTs of the prior art can be used to determine the effect on collector current density of having a base layer with a lower band gap.

All of the GaAs devices used in the following discussion have MOCVD-grown, carbon-doped base layers in which the dopant concentration varied from about $1.5 \times 10^{19}$ cm$^{-3}$ to about $6.5 \times 10^{19}$ cm$^{-3}$ and a thickness varied from about 500 Å to about 1500 Å, resulting in a base sheet resistivity ($R_{sb}$) of between 100 Ω/square and 400 Ω/square. Large area devices (L=75 μm×75 μm) were fabricated using a simple wet-etching process and tested in the common base configuration. Relatively small amounts of indium (x~1%) and nitrogen (y~0.3%) were added incremental to form two separate sets of InGaP/GaInAsN DHBTs. For each set, growth has been optimized to maintain high, uniform carbon dopant levels (>$2.5 \times 10^{19}$ cm$^{-3}$), good mobility (~85 cm$^2$/V-s), and high dc current gain (>60 at $R_{sb}$~300 Ω/square).

Typical Gummel plots from a GaAs/GaAs BJT, an InGaP/GaAs HBT and an InGaP/GaInAsN DHBT with comparable base sheet resistivities were plotted and overlaid in FIG. 2. The collector currents of the InGaP/GaAs HBT and GaAs/GaAs BJT were indistinguishable for over five decades of current until differences in effective series resistance impact the current-voltage characteristics. On the other hand, the collector current of an InGaP/GaInAsN DHBT was 2 fold higher than the collector current of the GaAs/GaAs BJT and the InGaP/GaAs HBT over a wide bias range, corresponding to a 25.0 mV reduction in turn-on voltage at a collector current density ($J_c$) of 1.78 A/cm$^2$. The observed increase in the low bias base current (n=2 component) in the BJT is consistent with an energy-gap driven increase in space charge recombination. The neutral base recombination component of the base current in the InGaP/GaInAsN DHBT was driven higher than in the InGaP/GaAs HBT because of the increase in collector current, as well as reduction in the minority carrier lifetime or an increase in the carrier velocity ($I_{nbr}=I_cw_b$/vr). InGaP/GaInAsN DHBT devices prepared to date have achieved a peal( dc current gain of 68 for a device having a base sheet resistivity of 234 Ω/square, corresponding to a decrease in turn-on voltage of 11.5 mV, and a peak dc current gain of 66 for a device having a base sheet resistivity of 303 Ω/square, corresponding to a decrease in turn-on voltage of 25.0 mV. This represents the highest known gain-to-base-sheet-resistance ratios ($\beta/R_{sb}$~0.2–0.3) for these types of structures. The energy-gap reduction in the $Ga_{1-x}In_xAs_{1-y}N_y$ base, is responsible for the observed decrease in turn-on voltage, as demonstrated by low temperature (77° K.) photoluminescence. DCXRD measurements indicate the lattice mismatch of the base layer is minimal (<250 arcsec).

In the diffusive limit, the ideal collector current density of a bipolar transistor as a function of base-emitter voltage ($V_{be}$) can be approximated as:

$$J_c = (qD_n n_{ib}^2/p_b w_b)\exp(qV_{be}/kT) \quad (1)$$

where $p_b$ and $w_b$ base doping and width;

$D_n$ diffusion coefficient;

$n_{ib}$ intrinsic carrier concentration in the base.

By expressing $n_{ib}$ as a function of base layer energy-gap ($E_{gp}$) and rewriting the product of base doping and thickness in terms of base sheet resistivity ($R_{sb}$), the turn-on voltage can be expressed as a logarithmic function of base sheet resistance $$V_{be} = -A \ln [R_{sb}] + V_o \quad (2)$$

with $$A = (kT/q) \quad (3)$$

and $$V_o = E_{gb}/q - (kT/q)\ln [q^2\mu N_c N_v D_n/J_c] \quad (4)$$

where $N_c$ and $N_v$ are the effective density of states in the conduction and valence bands and μ is the majority carrier mobility in the base layer.

Figure 3:
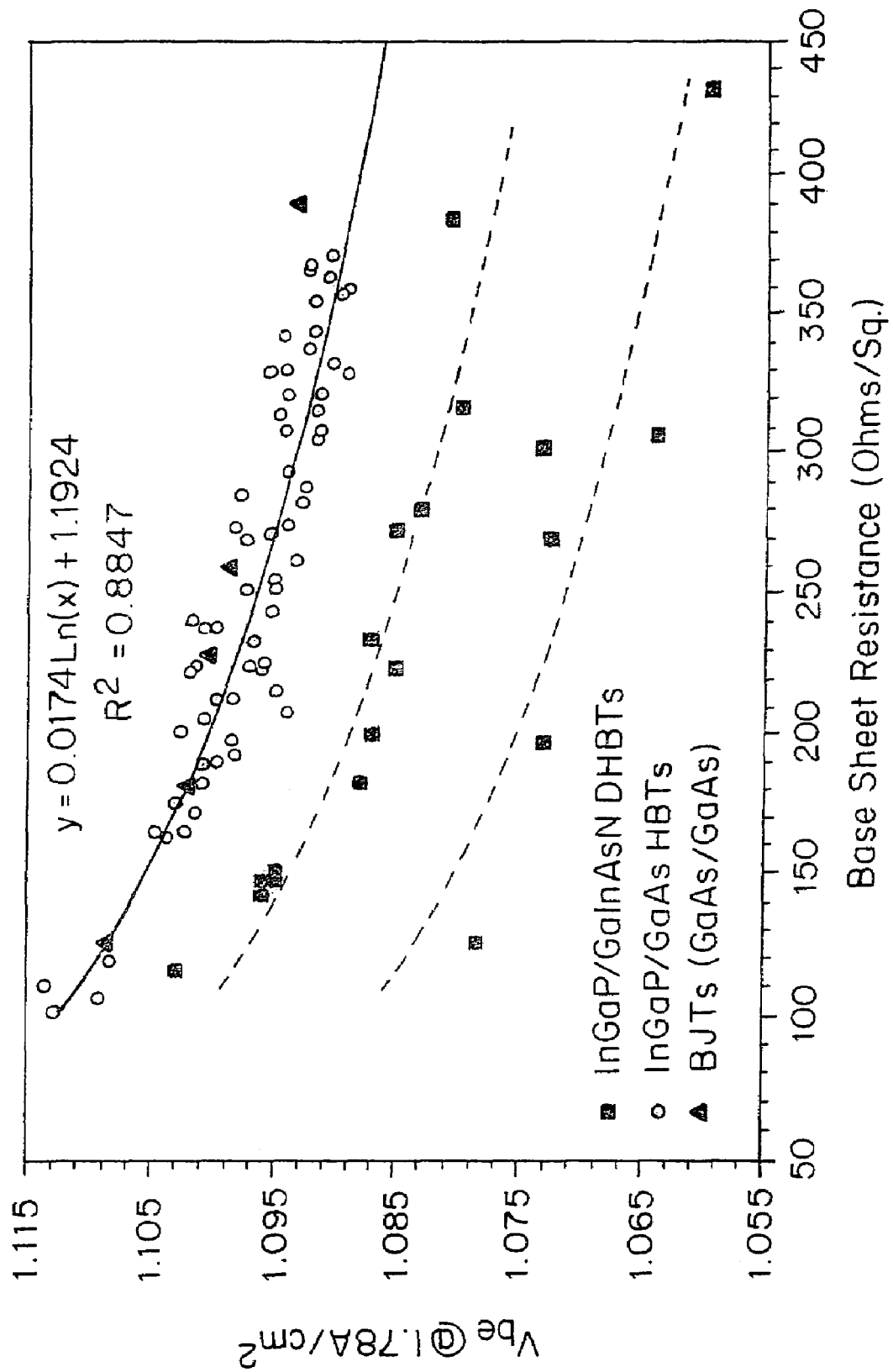
FIG. 3 is a graphical illustration of turn on voltage (at $J_c=1.78$ A/cm$^2$) as a function of base sheet resistance for an InGaP/GaInAsN DHBT of the invention and for an InGaP/GaAs HBT and a GaAs/GaAs BJT of the prior art.

FIG. 3 plots the turn-on voltage at $J_c$=1.78 A/cm$^2$ as a function of base sheet resistivity for a number of InGaP/GaAs HBTs, GaAs/GaAs BJTs, and InGaP/GaInAsN DHBTs. The turn-on voltage of both the InGaP/GaAs HBTs and the GaAs/GaAs BJTs, which do not have any conduction band spike, qualitatively exhibit the same logarithmic dependence on base sheet resistivity expected from equation (2). Quantitatively, the variation of base-emitter voltage ($V_{be}$) with base sheet resistivity is less severe than represented by equation (3) (A=0.0174 instead of 0.0252 mV). However, this observed reduction in A is consistent with the quasiballistic transport through thin base GaAs bipolar devices.

Comparison with the characteristics of GaAs/GaAs BJTs leads to the conclusion that the effective height of the conduction band spike InGaP/GaAs HBTs can be zero, with the collector current exhibiting ideal (n=1) behavior. Thus, InGaP/GaAs HBTs can be engineered to have no conduction band spike. Similar results were found by previous work for AlGaAs/GaAs HBTs. To further lower the turn-on voltage for these devices for a fixed base sheet resistivity requires the use of a base material with a lower energy gap but which still maintains the conduction band continuity. $Ga_{1-x}In_xAs_{1-y}N_y$ can be used to reduce $E_{gb}$ while maintaining near lattice matching conditions. As seen in FIG. 3, the turn-on voltage of two sets of InGaP/GaInAsN DHBTs follows a logarithmic dependence on base sheet resistivity indicating that the conduction band spike is about zero. In addition, the turn-on voltage is shifted downward by 11.5 mV in one set and by 25.0 mV in the other set (dashed lines) from that observed for InGaP/GaAs HBTs and GaAs/GaAs BJTs.

The above experiment shows that the turn-on voltage of GaAs-based HBTs can be reduced below that of GaAs BJTs by using a InGaP/GaInAsN DHBT structure. A low turn-on voltage is achieved through-two key steps. The base-emitter interface is first optimized to suppress the conduction band spike by selecting base and emitter semiconductor materials in which the conduction bands are at about the same energy level. This is successfully done using InGaP or AlGaAs as the emitter material and GaAs as the base. A further reduction in turn-on voltage was then accomplished by lowering the band gap of the base layer. This was achieved while still maintaining lattice matching throughout the entire HBT structure by adding both indium and nitrogen to the base layer. With proper growth parameters, a 2 fold increase in collector current density was achieved without sacrificing base doping or minority carrier lifetime (β=68 at $R_{sb}$=234 Ω/square). These results indicate that the use of a $Ga_{1-x}In_xAs_{1-y}N_y$ material provides a method for lowering the turn-on voltage in GaAs based HBTs and DHBTs. Since incorporation of indium and nitrogen in GaAs lowers the band gap of the material, larger reductions in turn-on voltage within GaAs based HBTs and DHBTs are expected as a larger percentage of indium and nitrogen is incorporated into the base if a high p-type doping concentration is maintained.

Figure 4:
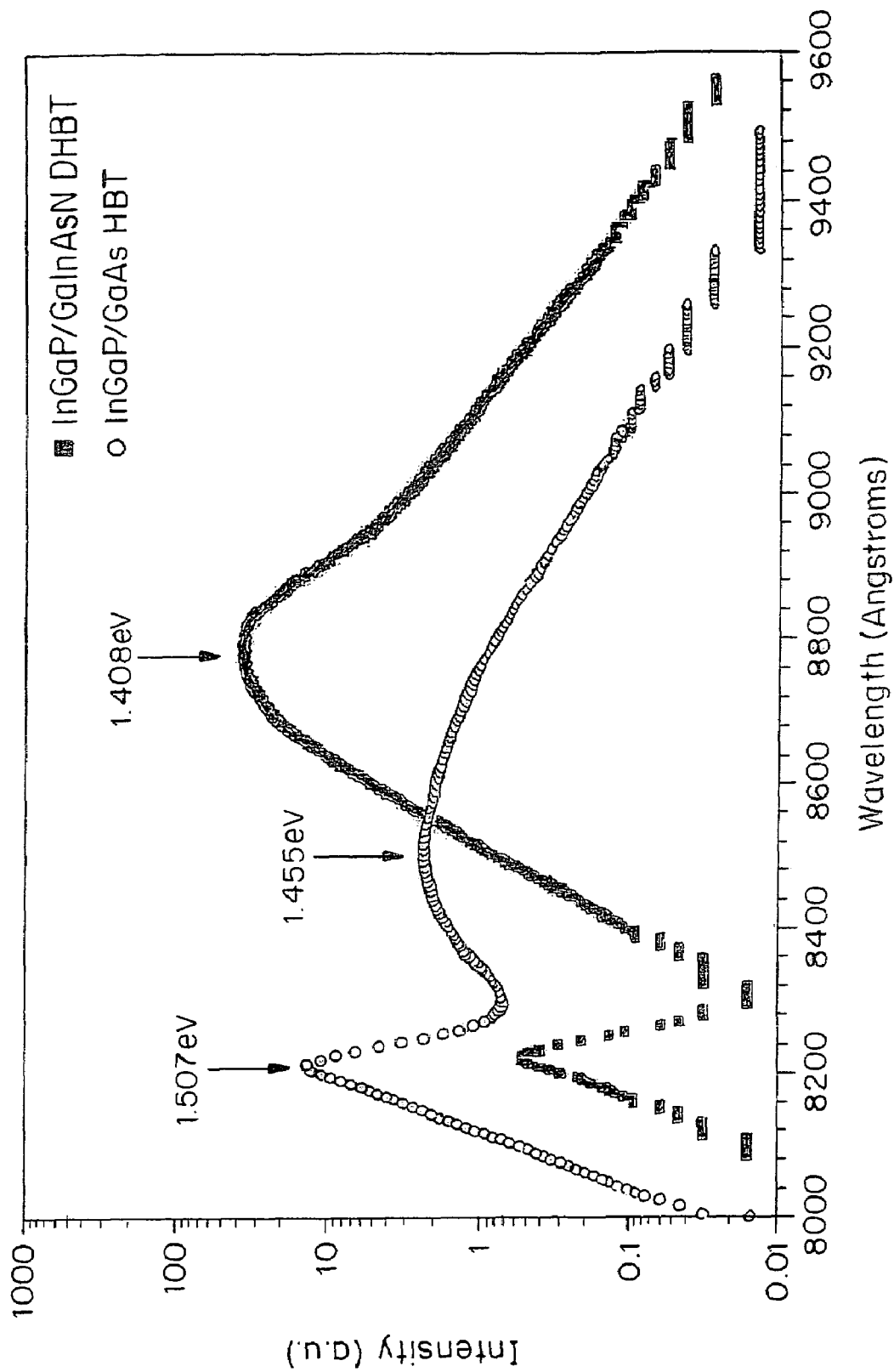
FIG. 4 illustrates the photoluminescence spectra measured at 77° K. of an InGaP/GaInAsN DHBT of the invention and of an InGaP/GaAs HBT of the prior art, both with a nominal base thickness of 1000 Å. Photoluminescence measurements were taken after etching off the InGaAs and GaAs cap layers, selectively stopping at the top of the InGaP emitter. The band gap of the n-type GaAs collector of both the InGaP/GaAs HBT and the InGaP/GaInAsN DHBT was 1.507 eV. The band gap of the p-type GaAs base layer of the nGaP/GaAs HBT was 1.455 eV, whereas the band gap of the p-type GaInAsN base layer of the InGaP/GaInAsN was 1.408 eV.

The energy-gap reduction in the GaInAsN base, assumed to be responsible for the observed decrease in turn-on voltage, has been confirmed by low temperature (77° K.) photoluminescence. FIG. 4 compares photoluminescence spectra from an InGaP/GaInAsN DHBT and a conventional InGaP/GaAs HBT. The base layer signal from the InGaP/GaAs HBT is at a lower energy than the collector (1.455 eV vs. 1.507 eV) because of band-gap-narrowing effects associated with high-doping-levels. The base layer signal from the InGaP/GaInAsN DHBT which appears at 1.408 eV is reduced because of band-gap-narrowing effects and a reduction in the base layer energy gap caused by incorporation of indium and nitrogen in the base layer. In this comparison, the doping levels are comparable, suggesting the 47 meV reduction in the position of the base layer signal can be equated to a reduction in the base layer energy gap in the GaInAsN base as compared with the energy gap of the GaAs base. This shift in photoluminescence signal correlates very well with the measured 45 mV reduction in turn-on voltage. In the absence of a conduction band spike, the turn-on voltage reduction can be directly related to the decrease in base layer energy gap.

Figure 5:
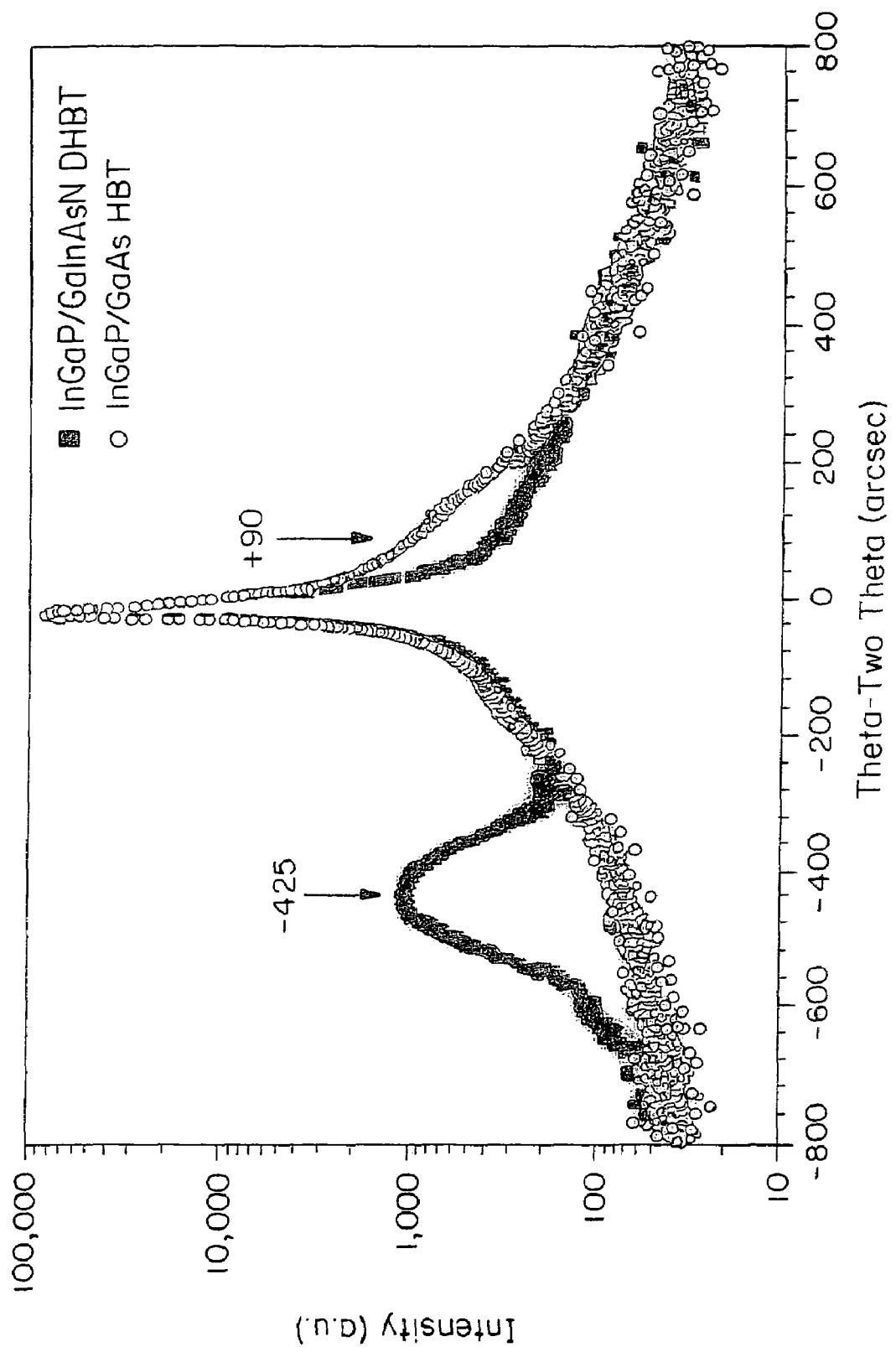
FIG. 5 illustrates double crystal x-ray diffraction (DCXRD) spectra of a InGaP/GaInAsN DHBT of the invention and a InGaP/GaAs HBT of the prior art, both having a nominal base thickness of 1500 Å. The positions of the base layers peaks are marked.

The DCRXD spectra shown in FIG. 5 illustrates the effect of addition of carbon dopants and indium to a GaAs semiconductor. FIG. 5 shows the DCRXD spectra from both an InGaP/GaInAsN DHBT and a standard InGaP/GaAs HBT of comparable base thickness. In the InGaP/GaAs HBT, the base layer is seen as a shoulder on the right hand side of the GaAs substrate peak, approximately corresponding to a position of +90 arcsecs, due to the tensile strain generated from the high carbon dopant concentration of $4 \times 10^{19}$ cm$^{-3}$. With the addition of indium, the base layer peak is at −425 arcsec in this particular InGaP/GaInAsN DHBT structure. In general, the position of the peak associated with the GaInAsN base is a function of the indium, nitrogen, and carbon concentrations. The addition of indium to GaAs adds a compressive strain, while both carbon and nitrogen compensate with a tensile strain.

Figure 6:
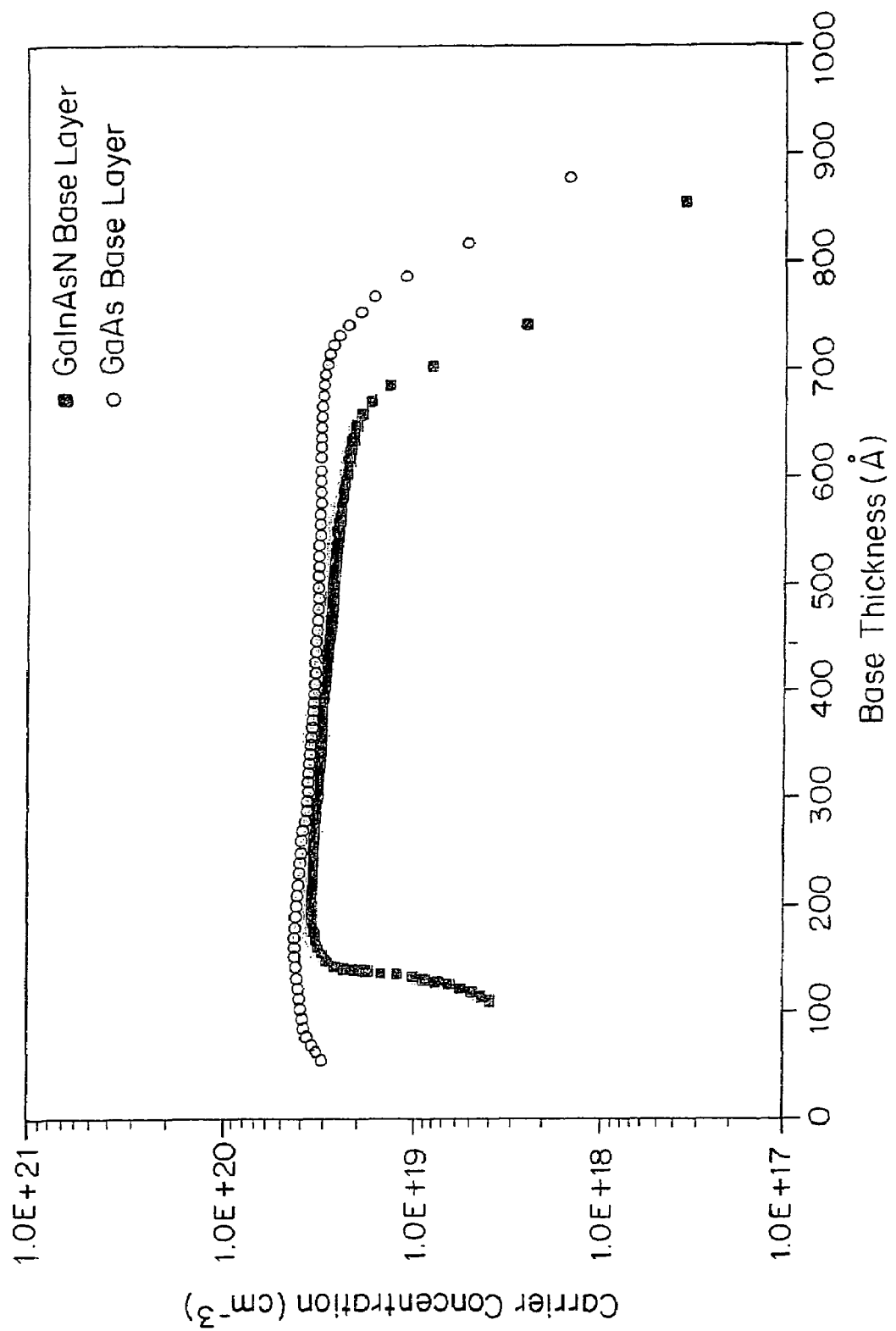
FIG. 6 is a Polaron C-V profile which illustrates the carrier concentration across the thickness of the base layer in an InGaP/GaInAsN DHBT of the invention and an InGaP/GaAs HBT of the prior art. Both the InGaP/GaInAsN DHBT and an InGaP/GaAs HBT have a nominal base thickness of 1000 Å. Both Polaron profiles are obtained after selectively etching down to the top of the base layer.

Maintaining high p-type doping levels as indium (and nitrogen) are added to carbon doped GaAs requires careful growth optimization. A rough estimate of the active doping level can be obtained from a combination of measured base sheet resistivity and base thickness values. The base doping can also be confirmed by first selectively etching to the top of the base layer and then obtaining a Polaron C-V profile. FIG. 6 compares such Polaron C-V doping profiles from a GaAs base layer and a GaInAsN base layer. In both case, doping levels exceeded $3 \times 10^{19}$ cm$^{-3}$.

Equivalents

While this invention has been particularly shown and described with references to preferred embodiments thereof, it will be understood by those skilled in the art that various changes in form and details may be made therein without departing from the scope of the invention encompassed by the appended claims.

What is claimed is:

1. A method of fabricating a heterojunction bipolar transistor comprising:

growing a base layer comprising gallium, indium, arsenic, and nitrogen over an n-doped GaAs collector from a gallium, indium, arsenic, and nitrogen source, wherein the base layer is p-doped with carbon from an external carbon source to thereby have a carbon-dopant concentration in a range of between about $1.5 \times 10^{19}$ cm$^{-3}$ to about $7.0 \times 10^{19}$ cm$^{-3}$; and growing an n-doped emitter layer over the base layer.

2. The method of claim 1, wherein the external carbon source is carbon tetrabromide or carbon tetrachloride.

3. The method of claim 2, wherein the gallium source is selected from trimethylgallium and triethylgallium.

4. The method of claim 3, wherein the nitrogen source is ammonia or dimethylhydrazine.

5. The method of claim 4, wherein the ratio of the arsenic source to the gallium source is about 2.0 to about 3.5.

6. The method of claim 5, wherein the base is grown at a temperature of less than 750° C.

7. The method of claim 6, wherein the base is grown at a temperature of about 500° C. to about 600° C.

8. The method of claim 6, wherein the base layer comprises a layer of the formula $Ga_{1-x}In_xAs_{1-y}N_y$, wherein x and y are each, independently, about $1.0 \times 10^{-4}$ to about $2.0 \times 10^{-1}$.

9. The method of claim 8, wherein x is about equal 3y.

10. The method of claim 8, wherein the collector is GaAs and the emitter is InGaP, AlInGaP, or AlGaAs and the transistor is a double heterojunction bipolar transistor.

11. The method of claim 8, further comprising the step of growing an n-doped first transitional layer over the collector and disposed between the base and the collector, wherein the first transitional layer has a graded band gap or a band gap that is smaller than the band gap of the collector.

12. The method of claim 11, wherein the first transitional layer is selected from the group consisting of GaAs, InGaAs, or InGaAsN.

13. The method of claim 12, further comprising the step of growing a second transitional layer over the base, wherein the second transitional layer has a first surface contiguous with a surface of the base and a second surface contiguous with a surface of the emitter, and wherein the second transitional layer has a doping concentration at least one order of magnitude less than the doping concentration of the emitter.

14. The method of claim 13, wherein the second transitional layer is selected from the group consisting of GaAs, InGaAs, or InGaAsN.

15. The method of claim 14, wherein the first transitional layer, the second transitional layer, or both the first and the second transitional layer have a doping spike.

16. The method of claim 14, further comprising the step of growing a lattice matched layer over the collector, wherein the lattice matched layer has a first surface contiguous with a first surface of the collector and a second surface contiguous with a second surface of the first transitional layer.

17. The method of claim 16, wherein the lattice matched layer is InGaP.

* * * * *